US012628695B2

(12) United States Patent
Jin

(10) Patent No.: US 12,628,695 B2
(45) Date of Patent: May 12, 2026

(54) PACKAGING STRUCTURE AND PACKAGING METHOD

(71) Applicant: Semiconductor Manufacturing International (Shanghai) Corporation, Shanghai (CN)

(72) Inventor: Jisong Jin, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 602 days.

(21) Appl. No.: 18/096,088

(22) Filed: Jan. 12, 2023

(65) Prior Publication Data

US 2023/0352467 A1     Nov. 2, 2023

(30) Foreign Application Priority Data

Apr. 29, 2022    (CN) .......................... 202210466508.5

(51) Int. Cl.
*H01L 23/00*          (2006.01)
*H01L 23/31*          (2006.01)
(Continued)

(52) U.S. Cl.
CPC .......... *H01L 25/18* (2013.01); *H01L 23/3128* (2013.01); *H01L 23/3135* (2013.01); *H01L 23/36* (2013.01); *H01L 24/16* (2013.01); *H01L 24/32* (2013.01); *H01L 24/73* (2013.01); *H01L 24/81* (2013.01); *H01L 24/83* (2013.01);
(Continued)

(58) Field of Classification Search
CPC . H01L 2224/16145; H01L 2224/16225; H01L
2224/32145; H01L 2224/73204; H01L
2224/81; H01L 2224/83; H01L
2224/92125; H01L 2225/06513; H01L
2225/06541; H01L 2225/06555; H01L
2225/06586; H01L 2225/06589; H01L
23/3128; H01L 23/3135; H01L 23/36;
H01L 23/3675; H01L 23/49816; H01L
23/5384; H01L 24/13; H01L 24/16; H01L
24/17; H01L 24/32; H01L 24/73;
(Continued)

(56) References Cited

U.S. PATENT DOCUMENTS 9,851,401 B2 * 12/2017 Kim ........................ G11C 29/00
11,276,620 B2 * 3/2022 Chang ................. H01L 21/6835
(Continued)

*Primary Examiner* — Telly D Green
(74) *Attorney, Agent, or Firm* — Crowell & Moring LLP

(57) ABSTRACT

This disclosure relates to a packaging structure and a packaging method. The structure includes: a substrate; a first chip, including a first surface and a second surface opposite to each other; a second chip, including a third surface, where the third surface includes a third bonding region bonded to the second bonding region, and a remaining region of the third surface is used as a fourth bonding region; a conductive post, arranged in the fourth bonding region; and a chipset, bonded to the first bonding region of the first chip, where the second bonding region is exposed from a projection of the chipset on the first chip. The chipset includes one or more third chips stacked along a longitudinal direction, adjacent third chips along the longitudinal direction are electrically connected, and the third chip adjacent to the first chip is electrically connected to the first chip.

10 Claims, 6 Drawing Sheets

(51) Int. Cl.

| | |
|---|---|
| *H01L 23/36* | (2006.01) |
| *H01L 25/00* | (2006.01) |
| *H01L 25/18* | (2023.01) |

(52) U.S. Cl.

CPC .............. *H01L 24/92* (2013.01); *H01L 25/50* (2013.01); *H01L 2224/16145* (2013.01); *H01L 2224/16225* (2013.01); *H01L 2224/32145* (2013.01); *H01L 2224/73204* (2013.01); *H01L 2224/81* (2013.01); *H01L 2224/83* (2013.01); *H01L 2224/92125* (2013.01)

(58) Field of Classification Search

CPC ......... H01L 24/81; H01L 24/83; H01L 24/92; H01L 25/0652; H01L 25/18; H01L 25/50

See application file for complete search history.

(56) References Cited

U.S. PATENT DOCUMENTS

| | | | | |
|---|---|---|---|---|
| 2014/0048928 A1* | 2/2014 | Li | ..................... | H01L 23/49811 |
| | | | | 257/737 |
| 2017/0133103 A1* | 5/2017 | Kwon | ...................... | G11C 7/10 |
| 2019/0273065 A1* | 9/2019 | Yu | ......................... | H01L 23/538 |
| 2019/0341370 A1* | 11/2019 | Keeth | ................. | H01L 25/0657 |
| 2020/0066612 A1* | 2/2020 | Hung | .................... | H01L 23/055 |
| 2020/0243449 A1* | 7/2020 | Chiang | .............. | H01L 23/5386 |
| 2020/0335479 A1* | 10/2020 | Li | ....................... | H01L 21/6836 |
| 2021/0202336 A1* | 7/2021 | Chang | ................... | H01L 24/32 |
| 2023/0352417 A1* | 11/2023 | Jin | ...................... | H01L 21/6835 |
| 2023/0352468 A1* | 11/2023 | Jin | ....................... | H01L 23/053 |

* cited by examiner

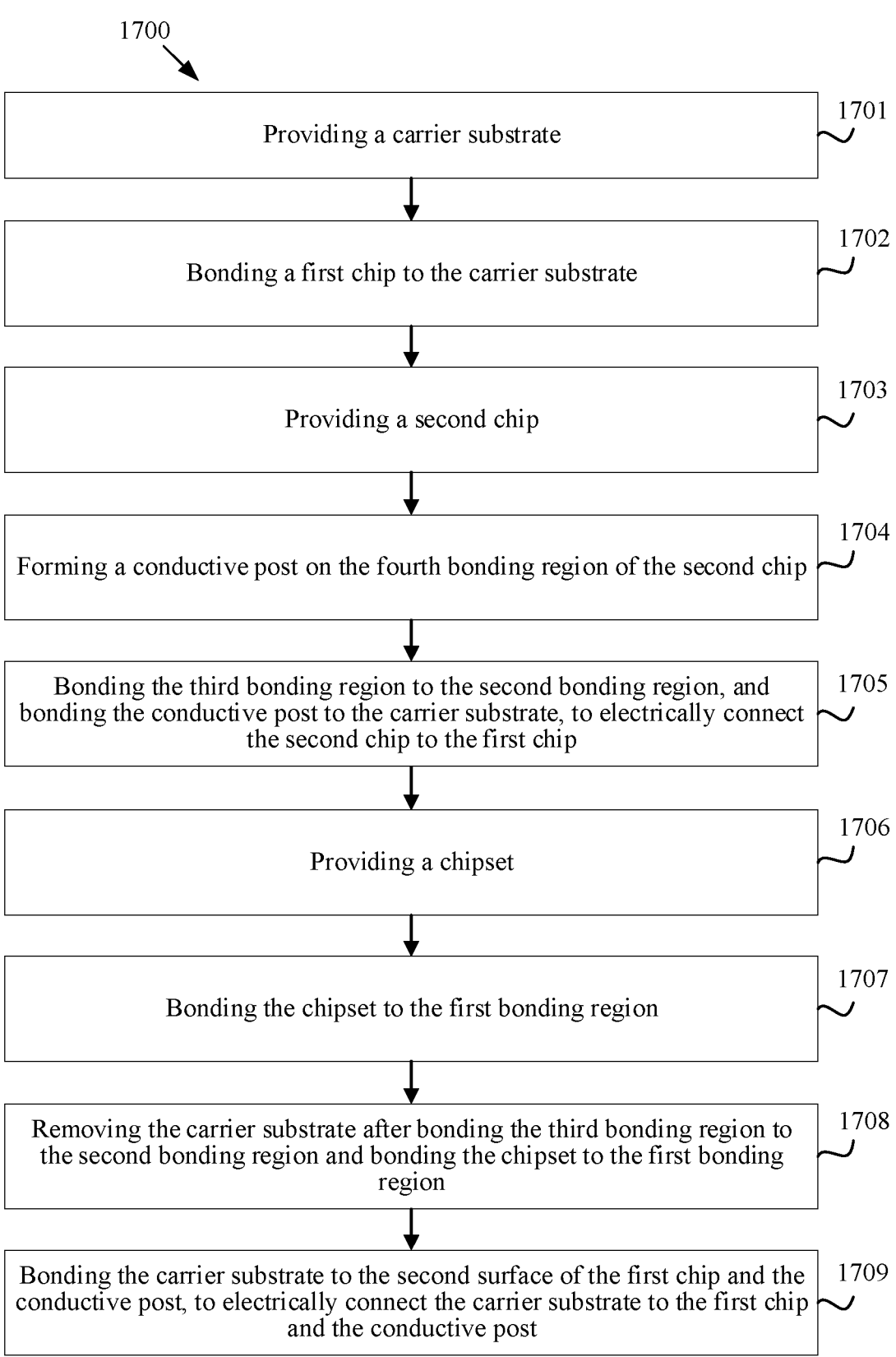

1700

| | |
|---|---|
| Providing a carrier substrate | 1701 |
| Bonding a first chip to the carrier substrate | 1702 |
| Providing a second chip | 1703 |
| Forming a conductive post on the fourth bonding region of the second chip | 1704 |
| Bonding the third bonding region to the second bonding region, and bonding the conductive post to the carrier substrate, to electrically connect the second chip to the first chip | 1705 |
| Providing a chipset | 1706 |
| Bonding the chipset to the first bonding region | 1707 |
| Removing the carrier substrate after bonding the third bonding region to the second bonding region and bonding the chipset to the first bonding region | 1708 |
| Bonding the carrier substrate to the second surface of the first chip and the conductive post, to electrically connect the carrier substrate to the first chip and the conductive post | 1709 |

PACKAGING STRUCTURE AND PACKAGING METHOD

CROSS REFERENCE TO RELATED APPLICATIONS

This application is based on and claims priority to Chinese patent Application No. 202210466508.5, filed Apr. 29, 2022, the entire content of which is incorporated herein by reference.

TECHNICAL FIELD

The present disclosure relates to the field of semiconductor packaging, and in particular, to a packaging structure and a packaging method.

BACKGROUND

A conventional chip manufacturing technology is being pushed to a limit in terms of a size of a single chip. However, applications are eager for a latest technology to realize a large-scale integrated circuit, and it is a challenge to achieve high-speed and small-volume interconnection between chips.

A current solution is a relatively small integrated circuit with a silicon bridge (Si bridge) chip being embedded in a silicon substrate. The Si bridge is used to realize interconnection between chips, thereby providing heterogeneous chip packaging.

However, current packaging structures are relatively complex, and a speed of communication between chips is to be improved.

SUMMARY

The forms of the present disclosure provide a packaging structure and a packaging method to improve a speed of communication between chips and optimize performance of the packaging structure.

In an aspect of the present disclosure, a packaging structure is provided. The packaging structure may include: a substrate; a first chip, including a first surface and a second surface opposite to each other, the first surface includes a first bonding region configured to bond to a chipset and a second bonding region configured to bond to a second chip, and the second surface is bonded to the substrate; a second chip, including a third surface, the third surface includes a third bonding region bonded to the second bonding region, and a remaining region of the third surface is used as a fourth bonding region; a conductive post, arranged in the fourth bonding region, an end of the conductive post facing away from the second chip is bonded to the substrate; and a chipset, bonded to the first bonding region of the first chip, where the second bonding region is exposed from a projection of the chipset on the first chip, the chipset includes one or more third chips stacked along a longitudinal direction, adjacent third chips along the longitudinal direction are electrically connected, and the third chip adjacent to the first chip is electrically connected to the first chip.

In another aspect of the present disclosure, a packaging method is provided. The packaging method may include: providing a carrier substrate; bonding a first chip to the carrier substrate, the first chip includes a first surface and a second surface opposite to each other, and the first surface includes a first bonding region configured to bond to a chipset and a second bonding region configured to bond to a second chip; providing a second chip, the second chip includes a third surface, the third surface includes a third bonding region corresponding to the second bonding region, and a remaining region of the third surface is used as a fourth bonding region; forming a conductive post on the fourth bonding region of the second chip; bonding the third bonding region to the second bonding region, and bonding the conductive post to the carrier substrate, to electrically connect the second chip to the first chip; providing a chipset, the chipset includes one or more third chips stacked along a longitudinal direction, and adjacent third chips along the longitudinal direction are electrically connected; bonding the chipset to the first bonding region, the second bonding region is exposed from a projection of the chipset on the first chip, and the third chip adjacent to the first chip is electrically connected to the first chip; removing the carrier substrate after bonding the third bonding region to the second bonding region and bonding the chipset to the first bonding region; and bonding a substrate to the second surface of the first chip and the conductive post, to electrically connect the substrate to the first chip and the conductive post.

Compared with the prior art, the forms of the present disclosure have the following advantages.

According to the packaging structure provided in the forms of the present disclosure, the third surface of the second chip includes the third bonding region bonded to the second bonding region, the conductive post is formed in the fourth bonding region on the third surface, the end of the conductive post facing away from the second chip is bonded to the substrate, the chipset is bonded to the first bonding region of the first chip, and the second bonding region is exposed from the projection of the chipset on the first chip. Since the second bonding region is exposed from the projection of the chipset on the first chip, a space can be provided for bonding a part of the second chip to the first chip, so that the part of the second chip can be directly stacked on and bonded to the second bonding region of the first chip, thereby realizing the electrical connection of the second chip to the first chip. In this way, the second chip can be electrically connected to the third chip by the first chip. Compared with electrically connecting the second chip to the first chip by a bridge, in the forms of the present disclosure, the bridge is omitted, which helps simplify the packaging structure, thin the packaging structure, and shorten transmission paths between the second chip and the first chip and between the second chip and the third chip, thereby improving speeds of communication between the second chip and the first chip and between the second chip and the third chip, and optimizing performance of the packaging structure.

In the packaging method provided in the forms of the present disclosure, the conductive post is formed in the fourth bonding region of the second chip, then the third bonding region is bonded to the second bonding region and the conductive post is bonded to the carrier substrate, and the chipset is bonded to the first bonding region. In addition, the first surface of the first chip includes the first bonding region for bonding the chipset and the second bonding region for bonding the second chip. Therefore, a space can be provided for bonding a part of the second chip to the first chip, so that a part of the second chip can be directly stacked on and bonded to the second bonding region of the first chip, thereby realizing the electrical connection between the second chip and the first chip. Compared with electrically connecting the second chip to the first chip by the bridge, in the forms of the present disclosure, the bridge is omitted, which helps simplify the packaging process and the packaging structure, thin the packaging structure, and shorten the transmission paths between the second chip and the first chip and between the second chip and the third chip, thereby improving speeds of communication between the second chip and the first chip and between the second chip and the third chip, and optimizing the performance of the packaging structure.

BRIEF DESCRIPTION OF THE DRAWINGS

FIG. 17 is a flowchart of a packaging method according to a form of the present disclosure.

DETAILED DESCRIPTION

It can be learned from the background that, current packaging structures are relatively complex, and a speed of communication between chips is to be improved. The reason why the current packaging structures are relatively complex and the speed of communication between chips is to be improved is analyzed with reference to two types of packaging structures.

Figure 1:
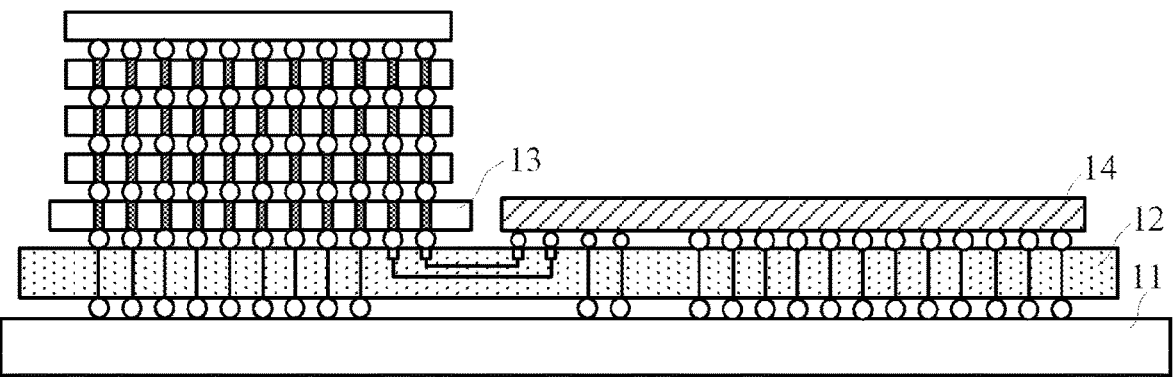
FIG. 1 is a schematic structural diagram of a packaging structure.

FIG. 1 is a schematic structural diagram of a packaging structure.

The packaging structure includes: a substrate 11, including a bonding surface (not shown); an interposer 12, bonded to the bonding surface of the substrate 11; one or more first chips 13, stacked in sequence from a bottom to a top and bonded to the interposer 12; and a second chip 14, bonded to the interposer 12 on a side of the first chip 13. The second chip 14 is electrically connected to the first chip 13 by the interposer 12.

In the packaging structure, the first chip 13 is electrically connected to the substrate 11 by the interposer 12, the second chip 14 is electrically connected to the substrate 11 by the interposer 12, and the second chip 14 is electrically connected to the first chip 13 by the interposer 12, which helps improve a speed of communication and performance of connection between the first chip 13 and the second chip 14.

However, in the field of semiconductor packaging, costs of the interposer 12 are relatively high, which tends to increase costs of the packaging structure. In addition, electrically connecting the chips and connecting the chip to the substrate by the interposer results in a relatively complex packaging structure.

Figure 2:
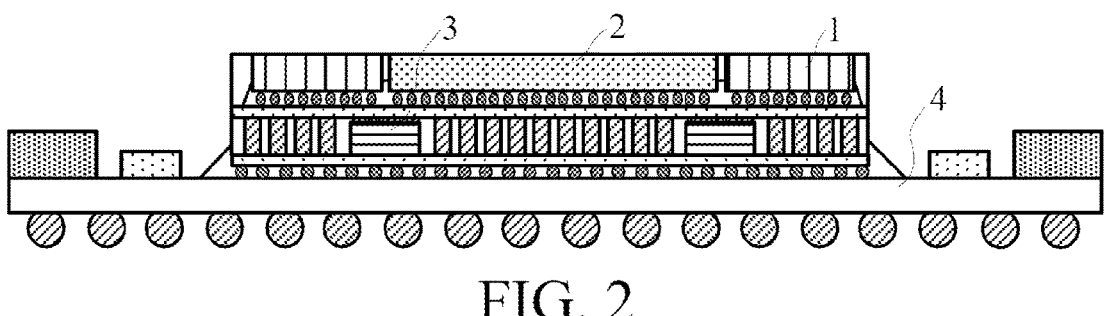
FIG. 2 and FIG. 3 are schematic structural diagrams of another packaging structure.
Figure 3:
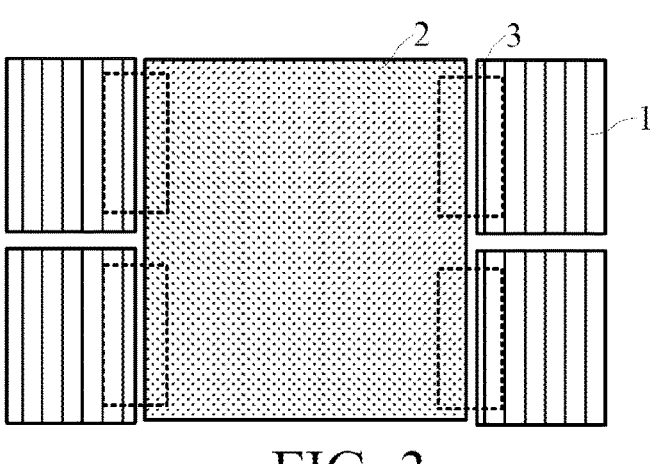

FIG. 2 and FIG. 3 are schematic structural diagrams of another packaging structure. FIG. 2 is a cross-sectional view, and FIG. 3 is a top view corresponding to FIG. 2.

The packaging structure includes: a substrate 4, including a bonding surface (not shown), a bridge 3, bonded to the bonding surface of the substrate 4; a packaging layer (not shown), arranged on the bonding surface and covering a sidewall of the bridge 3; a first chip 1, bonded to the packaging layer and the bridge 3 and electrically connected to the bridge 3; and a second chip 2, bonded to the packaging layer exposed from the first chip 1 and to the bridge 3 and electrically connected to the bridge 3. The second chip 2 is connected to the first chip 1 by the bridge 3.

Electrically connecting the first chip 1 to the second chip 2 by the bridge 3 having lower costs in the packaging structure helps reduce the costs of the packaging structure compared with electrically connecting the first chip to the second chip by the interposer.

However, electrically connecting the first chip 1 to the second chip 2 by the bridge 3 leads to a relatively complex packaging structure and a relatively long transmission path between the first chip 1 and the second chip 2, resulting in a difficulty in improving the speed of communication between the first chip 1 and the second chip 2.

In order to address the technical problem, an form of the present disclosure provides a packaging structure. A third surface of the second chip includes a third bonding region bonded to the second bonding region, a conductive post is formed on a fourth bonding region on the third surface, an end of the conductive post facing away from the second chip is bonded to the substrate, the chipset is bonded to the first bonding region of the first chip, and the second bonding region is exposed from a projection of the chipset on the first chip. Therefore, in the forms of the present disclosure, since the second bonding region is exposed from the projection of the chipset on the first chip, a space can be provided for bonding a part of the second chip to the first chip, so that the part of the second chip can be directly stacked on and bonded to the second bonding region of the first chip, thereby realizing the electrical connection of the second chip to the first chip. In this way, the second chip can be electrically connected to the third chip by the first chip. Compared with electrically connecting the second chip to the first chip by the bridge, in this form of the present disclosure, the bridge is omitted, which helps simplify the packaging structure, thin the packaging structure, and shorten transmission paths between the second chip and the first chip and between the second chip and the third chip, thereby improving speeds of communication between the second chip and the first chip and between the second chip and the third chip, and optimizing the performance of the packaging structure.

Figures 4, 5, 6, 7:
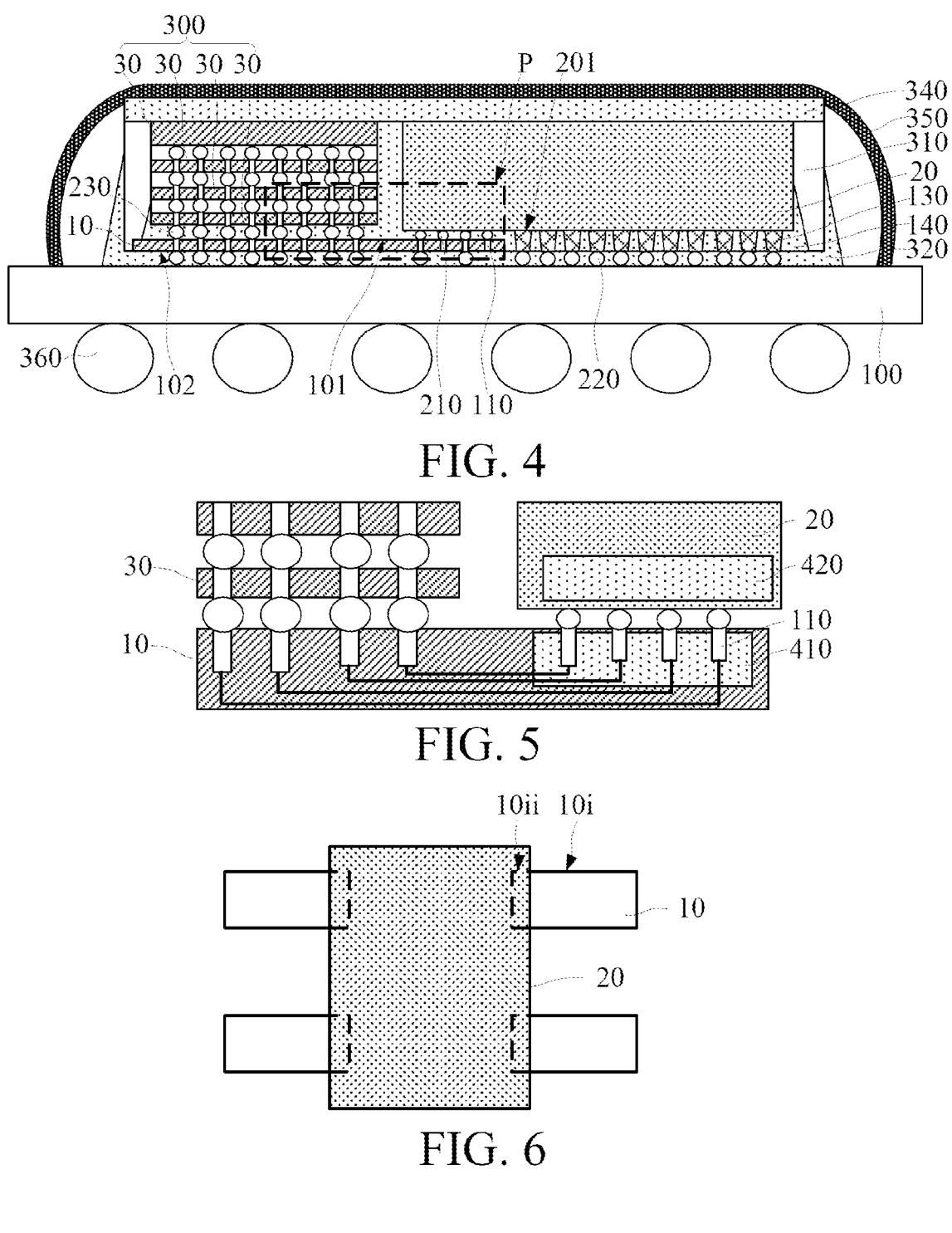
FIG. 4 to FIG. 6 are schematic structural diagrams of a packaging structure according to a form of the present disclosure.
FIG. 7 to FIG. 16 are schematic structural diagrams corresponding to steps in a packaging method according to a form of the present disclosure.

In order to make the foregoing objectives, features, and advantages of the forms of the present disclosure more apparent and easier to understand, specific forms of the present disclosure are described in detail below with reference to the accompanying drawings. FIG. 4 to FIG. 6 are schematic structural diagrams of an form of a packaging structure according to the present disclosure. FIG. 4 is a cross-sectional view, FIG. 5 is a partial enlarged view at a position P in FIG. 4, and FIG. 6 is a top view corresponding to FIG. 4.

In this form, the packaging structure includes: a substrate 100; a first chip 10, including a first surface 101 and a second surface 102 facing away from each other, where the first surface 101 includes a first bonding region 10i (shown in FIG. 6) configured for bonding a chipset 300 and a second bonding region 10ii (shown in FIG. 6) configured for bonding a second chip 20, and the second surface 102 is bonded to the substrate 100; a second chip 20, including a third surface 201, where the third surface 201 includes a third bonding region 20I (with reference to FIG. 9) bonded to the second bonding region 10ii, and a remaining region of the third surface 201 is used as a fourth bonding region 20II (with reference to FIG. 9); a conductive post 130, arranged in the fourth bonding region 20II, where an end of the conductive post 130 facing away from the second chip 20 is bonded to the substrate 100; and a chipset 300, bonded to the first bonding region 10i of the first chip 10, where the second bonding region 10ii is exposed from a projection of the chipset 300 on the first chip 10, the chipset 300 includes one or more third chips 30 stacked along a longitudinal direction, adjacent third chips 30 along the longitudinal direction are electrically connected, and the third chip 30 adjacent to the first chip 10 is electrically connected to the first chip 10.

The substrate 100 is configured to be bonded to the first chip 10 and the conductive post 130, thereby realizing packaging integration and electrical integration of the first chip 10, the chipset 300, and the second chip 20 with the substrate 100.

The substrate 100 is electrically connected to the first chip 10 and the conductive post 130, so that the substrate 100 is electrically connected to the chipset 300 by the first chip 10 and is electrically connected to the second chip 20 by the conductive post 130. In this form, the substrate 100 is a printed circuit board (PCB).

The first bonding region 10i of the first chip 10 is configured for bonding the chipset 300, and the second bonding region 10ii of the first chip 10 is configured for bonding the second chip 20. Therefore, the second chip 20 can be electrically connected to each of the third chips 30 in the chipset 300 by the first chip 10.

In this form, the first chip 10 is a first logic chip configured to perform logic control on each of the third chips 30 in the chipset 300.

The second bonding region 10ii of the first chip 10 is configured to be bonded to a third bonding region 20II of the second chip 20, thereby realizing the electrical connection between the first chip 10 and the second chip 20.

With reference to FIG. 5, in this form, a first interface circuit 410 is formed in the second bonding region 10ii of the first chip 10. The first interface circuit 410 is configured to realize electrical connection between the second bonding region 10ii and the third bonding region 20II of the second chip 20. Specifically, in this form, the first interface circuit 410 includes a connection structure 110. The connection structure 110 is exposed from the surface of the first chip 10.

The connection structure 110 is used as an external terminal of the first interface circuit 410 to realize the electrical connection between the first chip 10 and the second chip 20. In a specific form, the connection structure 110 may be a through silicon via (TSV) interconnecting structure.

It should be noted that, a ratio of an area of the second bonding region 10ii to a total area of the first chip 10 is neither excessively small nor excessively large. An excessively small ratio tends to result in an excessively small bonding space provided for the second chip 20 to the first chip 10, which tends to increase difficulty of bonding the second chip 20 to the first chip 10. An excessively large ratio tends to result in an excessively large area of the first chip 10, which tends to increase a transverse dimension of the packaging structure. Therefore, in this form, the ratio of the area of the second bonding region 10ii to the total area of the first chip 10 ranges from 5% to 20%.

The second chip 20 is configured to be bonded to the first chip 10, so as to be electrical connected to the first chip 10. Therefore, the second chip 20 can be electrically connected to the chipset 300 stacked on the first chip 10 by the first chip 10.

In this form, the second chip 20 is a second logic chip configured to perform logic control on the chipset 300. Specifically, the second logic chip may be a CPU chip, a GPU chip, or an SoC chip.

The second chip 20 has a first surface 201. The third bonding region 20I is configured to be bonded to the second bonding region 10ii of the first chip 10, and the fourth bonding region 20II is configured to form the conductive post 130, to realize the electrical connection between the second chip 20 and the substrate 100 by the conductive post 130.

In this form, the third bonding region 20I and the second bonding region 10ii are arranged oppositely, and are electrically connected, thereby realizing the electrical connection between the second chip 20 and the first chip 10.

Specifically, referring to FIG. 5, a second interface circuit 420 is formed in the third bonding region 20I. The second interface circuit 420 and the first interface circuit 410 are arranged oppositely and are electrically connected.

In this form, the packaging structure further includes first conductive bumps 210 arranged between the third bonding region 20I and the second bonding region 10ii. The first conductive bumps 210 are configured to be electrically connected between the third bonding region 20I and the second bonding region 10ii, thereby realizing the electrical connection between the first chip 10 and the second chip 20. More specifically, the first conductive bumps 210 are electrically connected to the first interface circuit 410 and the second interface circuit 420.

It should be noted that, in this form, the first conductive bumps 210 arranged between the third bonding region 20I and the second bonding region 10ii are microbumps (μbump), and the microbumps are arranged relatively densely, thereby helping improve the speed of communication between the first chip 10 and the second chip 20.

In this form, a material of each of the first conductive bumps 210 includes one or more of tin, copper, aluminum, tungsten, cobalt, nickel, titanium, tantalum, titanium nitride, or tantalum nitride. In an example, the material of the first conductive bump 210 is tin.

The conductive post 130 is configured to electrically connect the second chip 20 to the substrate 100. The conductive post 130 can offset a height difference between the third surface 201 and the second surface 102 of the first chip 10, so that a height difference between an end surface on the side of the conductive post 130 facing away from the second chip 20 and the second surface 102 of the first chip 10 is relatively small, thereby providing a relatively flat top surface for bonding the substrate 100. Correspondingly, the process difficulty of bonding the substrate 100 is reduced. Therefore, a height of the conductive post 130 depends on the height difference between the second surface 102 and the third surface 201.

It should be noted that, in this form, an end surface on a side of the conductive post 130 facing away from the first chip 10 is flush with the second surface 102 of the first chip 10, so that a flat surface having the same height can be provided for bonding the substrate 100 on the conductive post 130 and the second surface 102, which helps further reduce the difficulty of bonding the substrate 100.

In other forms, when the height difference between the end surface on the side of the conductive post facing away from the first chip and the second surface falls within a preset difference range, the height difference between the third surface and the second surface can also be offset.

In this form, a plurality of conductive posts 130 are arranged. The plurality of conductive posts 130 are separately arranged in the fourth bonding region 20II of the second chip 20.

A material of each of the conductive posts 130 is a conductive material. Specifically, the material of the conductive post 130 is metal, including any one or more of copper, titanium, aluminum, gold, nickel, iron, tin, silver, zinc, or chromium. In this form, the material of the conductive post 130 is copper, that is, the conductive post 130 is a copper post.

In this form, the packaging structure further includes second conductive bumps 220 arranged between the substrate 100 and the second surface 102 of the first chip 10 and between the substrate 100 and the end of the conductive post 130 facing away from the second chip 20. The substrate 100 is electrically connected to the second surface 102 of the first chip 10 and the substrate 100 is electrically connected to the conductive post 130 by the second conductive bumps 220.

In this form, the second conductive bumps 220 are in contact with the second surface 102 of the first chip 10, the conductive post 130, and the substrate 100, so that the electrical connection between the substrate 100 and the first surface 102 of the first chip 10 and the conductive post 130 can be realized merely by the second conductive bumps 220 without an additional interposer structure, thereby helping further shorten the transmission paths between the substrate 100 and the first surface 102 of the first chip 10 and the conductive post 130, and further improve the performance of the packaging structure.

In this form, the second conductive bumps 220 are first solder balls. In this form, a material of each of the second conductive bumps 220 includes one or more of tin, copper, aluminum, tungsten, cobalt, nickel, titanium, tantalum, titanium nitride, or tantalum nitride. In an example, the material of the second conductive bump 220 is tin.

Specifically, the first solder ball is controlled collapse chip connection (C4). C4 has excellent electrical and thermal properties. In case of a same solder ball spacing, C4 can achieve a higher I/O density, and is free of limitation by a size of an interconnecting structure. In addition, C4 is suitable for mass production and greatly reduces a size and a weight.

The chipset 300 is configured to be bonded to the first chip 10, and is electrically connected to the second chip 20 by the first chip 10, so as to form a corresponding packaging structure and thereby realize corresponding functions.

In this form, one or more third chips 30 stacked along a longitudinal direction form a high-bandwidth memory (HBM) structure with the first chip 10. The HBM structure helps satisfy a demand for a higher information transmission speed.

In this form, the third chip 30 is a memory chip, for example, a DRAM chip. Correspondingly, in this form, the first chip 10 is used as a first logic chip to control the memory chip.

In this form, when the chipset 300 includes two or more third chips 30, adjacent third chips 30 along the longitudinal direction are electrically connected, thereby realizing electrical integration between the third chips 30. One or more third chips 30 may be arranged. In this form, four third chips 30 are arranged, for example. In other forms, another number of third chips may be arranged.

In this form, along a direction parallel to the surface of the first chip 10, a transverse dimension of each of the third chips 30 is less than a transverse dimension of the first chip 10, so that a part of the first chip is exposed from the chipset 300. That is, the second bonding region 10_ii_ is exposed from the chipset 300, thereby providing a space for bonding the second chip 20 to the first chip 10.

The third chip 30 adjacent to the first chip 10 is electrically connected to the first chip 10, so that the electrical integration between the chipset 300 and the first chip 10 is realized by electrically connecting each of third chips 30 in the chipset 300 to the first chip 10.

In this form, the packaging structure further includes third conductive bumps 230 arranged between the first bonding region 10_i_ of the first chip 10 and the chipset 300. The chipset 300 is electrically connected to the first bonding region 10_i_ of the first chip 10 by the third conductive bumps 230.

In this form, a material of each of the third conductive bumps 230 includes one or more of tin, copper, aluminum, tungsten, cobalt, nickel, titanium, tantalum, titanium nitride, or tantalum nitride. In an example, the material of the third conductive bump 230 is tin.

It should be noted that, in this form, the first chip 10 is bonded to the chipset 300 by the third conductive bump 230 and the second chip 20 is bonded to the first chip 10 by the first conductive bump 210, for example. However, the bonding between the first chip and the chipset and between the second chip and the first chip is not limited thereto. For example, in other forms, the third conductive bump and the first conductive bump are one conductive bump. Therefore, the bonding between the first chip and the chipset and between the second chip and the first chip can be realized by the one conductive bump.

In this form, the packaging structure further includes a first sealing layer 140 arranged between the second bonding region 10_ii_ and the third bonding region 20I and configured to fill a gap between the first conductive bumps 120 and fill a region defined by the fourth bonding region 20II and the conductive post 130.

The first sealing layer 140 is configured to seal the first conductive bumps 210 and the conductive post 130, to protect the first conductive bumps 210 and the conductive post 130, and correspondingly improve packaging reliability.

In this form, the first sealing layer 140 is also filled in a region defined by the first bonding region 10_i_ of the first chip 10, the chipset 300, and the third conductive bumps 230 to seal the third conductive bumps 230.

In an example, a material of the first sealing layer 140 is epoxy resin.

In this form, the packaging structure further includes a first packaging layer 310 arranged on the substrate 100 and covering the chipset 300, a sidewall of the second chip 20, and the first chip 10. The first packaging layer 310 is configured to realize packaging integration of the chipset 300 with the first chip 10 and the second chip 20. The first packaging layer 310 can further function to provide insulation, sealing, and moisture protection, thereby helping improve the packaging reliability.

In an form, a material of the first packaging layer 310 is a molding material, for example, epoxy resin. Epoxy resin has advantages such as low shrinkage, desirable viscosity, desirable corrosion resistance, excellent electrical properties, and low costs. In other forms, the first packaging layer may be made of other suitable packaging materials.

In other forms, the packaging structure may further include a second packaging layer arranged on the first chip on a side of the chipset and from which the second bonding region is exposed. The second bonding region is exposed from the second packaging layer, to facilitate bonding of the second bonding region to the second chip.

In this form, the packaging structure further includes a second sealing layer 320 arranged in a gap between adjacent second conductive bumps 220 between the second surface 102 and the substrate 100 and in a gap between adjacent second conductive bumps 220 between a bottom surface of the first packaging layer 310 and the substrate 100, to seal the second conductive bumps 220.

In an example, a material of the second sealing layer 320 is epoxy resin.

In this form, the packaging structure further includes a thermally conductive layer 340 arranged on the chipset 300, the second chip 20, and the first packaging layer 310. The thermally conductive layer 340 is configured to realize heat conduction and heat dissipation.

In this form, a material of the thermally conductive layer 340 is a thermal interface material (TIM). For example, the material of the thermally conductive layer 340 is silica gel.

In this form, the packaging structure further includes a packaging housing 350 arranged on the substrate 100 and covering the chipset 300, the second chip 20, the first chip 10, and the first packaging layer 310. Specifically, in this form, the packaging housing 350 is arranged on the thermally conductive layer 340 and is in contact with the thermally conductive layer 340, so that the thermally conductive layer 340 realizes heat dissipation.

The packaging housing 340 is configured for mechanical protection of the chips inside and transitional connection of chip electrodes to the outside, and helps ensure correct realization of various functional parameters of the chips and environmental conditions required when the circuit is used.

In this form, a material of the packaging housing 340 includes metal, that is, the packaging housing 340 is a metal packaging housing. In other forms, the packaging housing may be a plastic packaging housing, a ceramic packaging housing, or the like.

In this form, the packaging structure further includes fourth conductive bumps 360 arranged on a surface on a side of the substrate 100 facing away from the first chip 10. The fourth conductive bumps 360 are configured to electrically connect the packaging structure to an external circuit. In this form, the fourth conductive bumps 360 are second solder balls. In an example, a material of each of the second solder balls is tin.

Correspondingly, an form of the present disclosure provides a packaging method 1700 as shown in FIG. 17. FIG. 7 to FIG. 16 are schematic structural diagrams corresponding to steps in an form of a packaging method 1700 according to the present disclosure. The packaging method 1700 in this form is described in detail below with reference to the drawings.

Referring to FIG. 7, a carrier substrate 101 is provided (1701). The carrier substrate 101 is configured to provide a process operation platform for subsequent bonding of a chipset to a second chip.

In this form, the carrier substrate 101 is a carrier substrate wafer. In other forms, the carrier substrate may be other types of carrier substrates. In this form, a material of the carrier substrate 101 may include one or more of silicon, glass, silicon oxide, or aluminum oxide.

Figures 8, 9, 10, 11, 12:
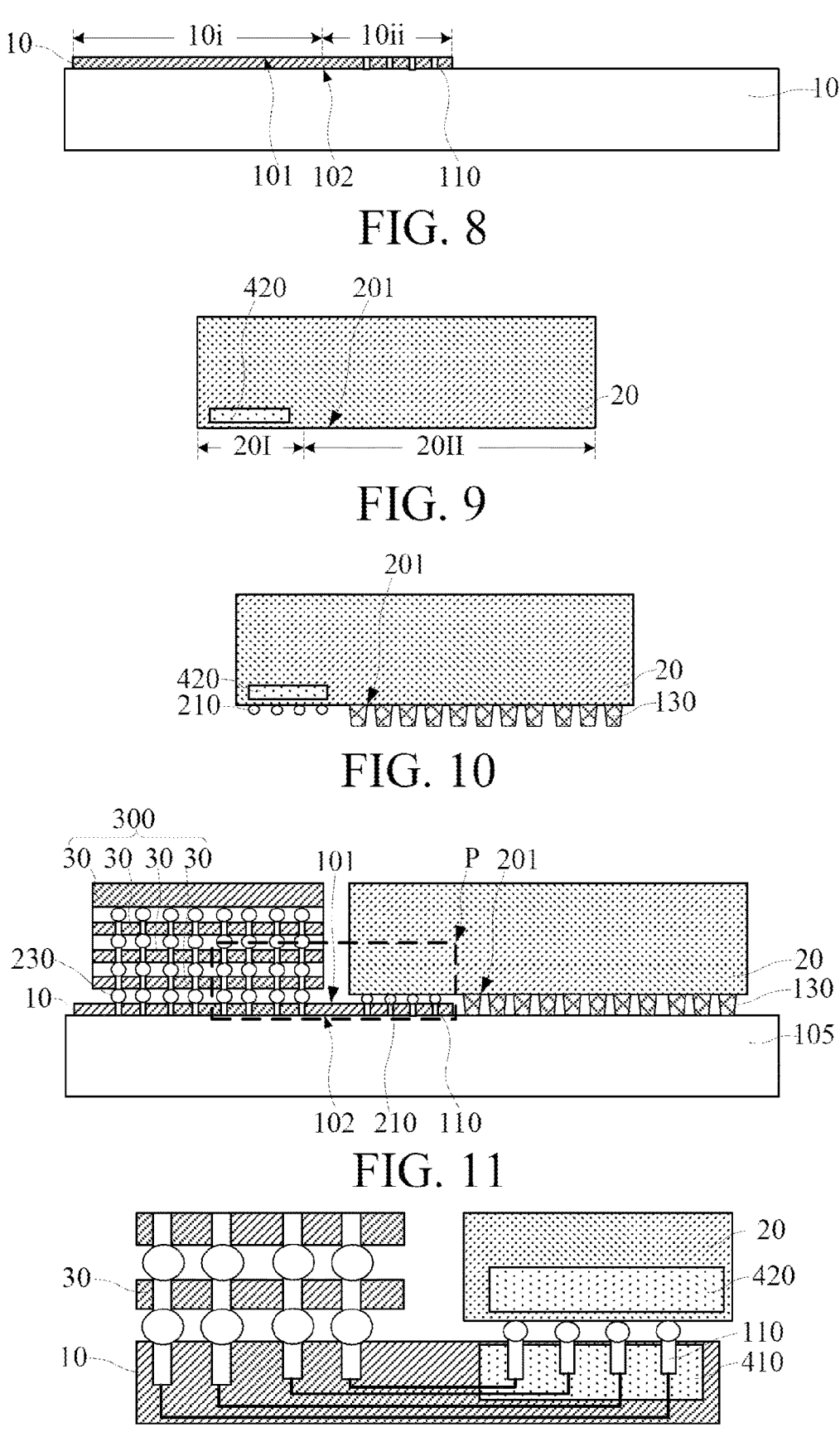

Referring to FIG. 8, a first chip 10 is bonded to the carrier substrate 101 (1702). The first chip 10 includes a first surface 101 and a second surface 102 opposite to each other, and the first surface 101 includes a first bonding region 10i configured for bonding a chipset and a second bonding region 10ii configured for bonding a second chip.

The first bonding region 10i of the first chip 10 is configured to be subsequently bonded to the chipset, and the second bonding region 10ii of the first chip 10 is configured to be subsequently bonded to the second chip. Therefore, electrical connection between the second chip and each of third chips in the chipset can be realized by the first chip 10.

In this form, the first chip 10 is a first logic chip configured to perform logic control on each of the third chips in the chipset.

In a specific form, the first chip 10 may be attached to the carrier substrate 101 by temporary bonding, so as to reduce difficulty of subsequent removal of the carrier substrate 101.

The second bonding region 10ii of the first chip 10 is configured to be bonded to a third bonding region 20II of the second chip 20, thereby realizing the electrical connection between the first chip 10 and the second chip 20.

In this form, a first interface circuit is formed in the second bonding region 10ii of the first chip 10. The first interface circuit is configured to realize electrical connection between the second bonding region 10ii and the third bonding region of the second chip.

Specifically, in this form, the first interface circuit includes a connection structure 110. The connection structure 110 is exposed from the surface of the first chip 10.

The connection structure 110 is used as an external terminal of the first interface circuit to realize the electrical connection between the first chip 10 and the second chip 20. In a specific form, the connection structure 110 may be a TSV interconnecting structure.

It should be noted that, a ratio of an area of the second bonding region 10ii to a total area of the first chip 10 is neither excessively small nor excessively large. An excessively small ratio tends to result in an excessively small bonding space provided for the second chip on the first chip 10, which tends to increase difficulty of bonding the second chip to the first chip 10. An excessively large ratio tends to result in an excessively large area of the first chip 10, which tends to increase a transverse dimension of the packaging structure. Therefore, in this form, the ratio of the area of the second bonding region 10ii to the total area of the first chip 10 ranges from 5% to 20%.

Referring to FIG. 9, a second chip 20 is provided (1703). The second chip includes a third surface 201. The third surface 201 includes a third bonding region 20I corresponding to the second bonding region 10ii, and a remaining region of the third surface 201 is used as a fourth bonding region 20II.

The second chip 20 is configured to be subsequently bonded to the first chip 10, so as to be electrically connected to the first chip 10. Therefore, the second chip 20 can be electrically connected to the chipset stacked on the first chip 10 by the first chip 10.

In this form, the second chip 20 is a second logic chip configured to perform logic control on the chipset 300. Specifically, the second logic chip may be a CPU chip, a GPU chip, or an SoC chip.

The second chip 20 has a first surface 201. The third bonding region 20I is configured to be subsequently bonded to the second bonding region 10ii of the first chip 10, and the fourth bonding region 20II is configured to subsequently form a conductive post, to realize the electrical connection between the second chip 20 and the substrate by the conductive post.

During subsequent bonding of the third bonding region 20I of the second chip 20 to the second bonding region 10ii of the first chip 10, the third bonding region 20I and the second bonding region 10ii of the first chip 10 are arranged oppositely and are electrically connected, thereby realizing the electrical connection between the second chip 20 and the first chip 10.

Specifically, a second interface circuit 420 is formed in the third bonding region 20I. The second interface circuit 420 is configured to be electrically connected to the first interface circuit 410 of the first chip 10, thereby realizing the electrical connection between the second chip and the first chip.

Referring to FIG. 10, a conductive post 130 is formed in the fourth bonding region 20II of the second chip 20 (1704).

After a carrier substrate 105 is subsequently removed, the conductive post 130 is configured to electrically connect the second chip 20 to the subsequent substrate. In addition, after the third bonding region 20I of the second chip 20 is subsequently bonded to the second bonding region 10ii of the first chip 10, the conductive post 130 can offset a height difference between the third surface 201 and the second surface 102 of the first chip 10, so that a height difference between an end surface on a side of the conductive post 130 facing away from the second chip and the second surface 102 of the first chip 10 is relatively small, thereby providing a relatively flat top surface for bonding the substrate during the subsequent bonding of the substrate. Correspondingly, the process difficulty of subsequently bonding the substrate is reduced.

Therefore, a height of the conductive post 130 depends on the height difference between the second surface 102 of the first chip and the third surface 201 of the second chip 20 after the third bonding region 20I of the second chip 20 is subsequently bonded to the second bonding region 10ii of the first chip 10.

In this form, a plurality of conductive posts 130 are arranged. The plurality of conductive posts 130 are separately arranged in the fourth bonding region 20II of the second chip 20.

A material of each of the conductive posts 130 is a conductive material. Specifically, the material of the conductive post 130 is metal, including any one or more of copper, titanium, aluminum, gold, nickel, iron, tin, silver, zinc, or chromium. In this form, the material of the conductive post 130 is copper, that is, the conductive post 130 is a copper post.

In an example, the step of forming the conductive post 130 on the fourth bonding region 20II of the second chip 20 includes: forming a patterned layer (not shown) on the second chip 20, where a plurality of vias located in the fourth bonding region 20II are formed in the patterned layer; forming the conductive posts 130 filled in the vias; and removing the patterned layer.

The patterned layer is configured to provide support for the formation of the conductive posts. The vias are configured to define a position, a size, and a shape of the conductive posts.

In this form, a process for filling the vias includes one or two of a chemical vapor deposition process, a physical vapor deposition process, or an electrochemical plating process.

The patterned layer is removed to expose the third surface 201 of the second chip 20, so as to facilitate subsequent bonding of the third bonding region 20I of the second chip 20 to the second bonding region 10ii of the first chip.

Figure 13:
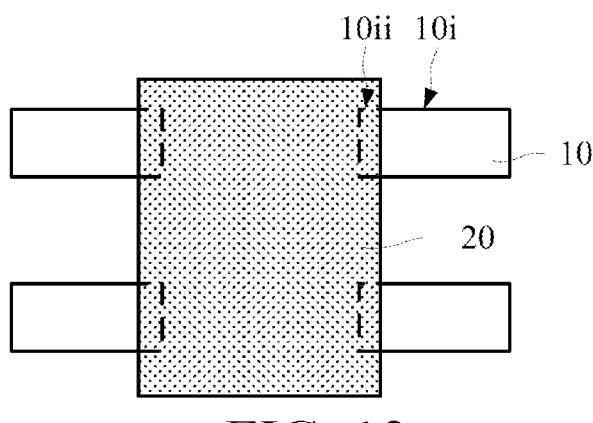

Referring to FIG. 11 to FIG. 13, FIG. 11 is a cross-sectional view, FIG. 12 is a partial enlarged view at a position P in FIG. 11, and FIG. 13 is a top view corresponding to FIG. 11, realizing the bonding of the third bonding region 20I to the second bonding region 10ii, bonding of conductive post 130 to the carrier substrate 105, and the electrical connection of the second chip 20 to the first chip 10 (1705).

Bonding the third bonding region 20I to the second bonding region 10ii means directly stacking and bonding a part of the second chip 20 on the second bonding region 10ii of the first chip 10, thereby realizing the electrical connection of the second chip 20 to the first chip 10. In this way, the second chip 20 can be electrically connected to the subsequent third chip by the first chip 10. Compared with electrically connecting the second chip to the first chip by a bridge, in this form, the bridge is omitted, which helps simplify a packaging process and a packaging structure, thin the packaging structure, and shorten transmission paths between the second chip 20 and the first chip 10 and between the second chip 20 and the third chip, thereby improving speeds of communication between the second chip 20 and the first chip 10 and between the second chip 20 and the third chip, and optimizing performance of the packaging structure.

Specifically, in this form, the third bonding region 20I and the second bonding region 10ii are arranged oppositely, and the third bonding region 20I is electrically connected to the second bonding region 10ii by the first conductive bumps 210.

The first conductive bumps 210 are configured to be electrically connected to the third bonding region 20I and the second bonding region 10ii, thereby realizing the electrical connection between the first chip 10 and the second chip 20. More specifically, the first conductive bumps 210 are electrically connected to the first interface circuit 410 and the second interface circuit 420.

It should be noted that, in this form, the second conductive bumps 210 arranged between the third bonding region 20I and the second bonding region 10ii are microbumps (μbump), and the microbumps are arranged relatively densely, thereby helping improve the speed of communication between the first chip 10 and the second chip 20.

In this form, a material of each of the first conductive bumps 210 includes one or more of tin, copper, aluminum, tungsten, cobalt, nickel, titanium, tantalum, titanium nitride, or tantalum nitride. In an example, the material of the first conductive bump 210 is tin.

Specifically, in this form, the first conductive bumps 210 are formed in the third bonding region 20II of the second chip 20, and the first conductive bumps 210 are connected to the second bonding region 10ii.

In other forms, the first conductive bumps may be formed in the second bonding region of the first chip, and the first conductive bumps are connected to the third bonding region. Alternatively, a first sub-bump is formed in the second bonding region of the first chip, a second sub-bump is formed in the third bonding region of the second chip, and the first sub-bump is connected to the second sub-bump.

It should be noted that, in this form, after the third bonding region 20I is bonded to the second bonding region 10ii and the conductive post 130 is bonded to the carrier substrate 105, an end surface on a side of the conductive post 130 facing away from the first chip 10 is flush with the second surface 102 of the first chip 10. Therefore, after the carrier substrate 105 is subsequently removed, a flat surface having the same height can be provided for bonding the substrate on the conductive post 130 and the second surface 102 of the first chip 10, which helps reduce the difficulty of subsequently bonding the substrate.

In other forms, when the height difference between the end surface on the side of the conductive post facing away from the first chip and the second surface falls within a preset difference range, the height difference between the third surface and the second surface can also be offset.

Still referring to FIG. 11 to FIG. 13, a chipset 300 is provided (1706). The chipset includes one or more third chips 30 stacked along a longitudinal direction, and adjacent third chips 30 along the longitudinal direction are electrically connected.

The chipset 300 is configured to be subsequently bonded to the first chip 10, and is electrically connected to the second chip by the first chip 10, so as to form a corresponding packaging structure and thereby realize corresponding functions.

After the chipset 300 is subsequently bonded to the first chip 10, the one or more third chips 30 stacked along the longitudinal direction form an HBM structure with the first chip 10. The HBM structure helps satisfy a demand for a higher information transmission speed.

In this form, the third chip 30 is a memory chip, for example, a DRAM chip. Correspondingly, in this form, after the chipset 300 is subsequently bonded to the first chip 10, the first chip 10 is used as a first logic chip to control the memory chip.

In this form, when the chipset 300 includes two or more third chips 30, adjacent third chips 30 along the longitudinal direction are electrically connected, thereby realizing electrical integration between the third chips 30. One or more third chips 30 may be arranged. In this form, four third chips 30 are arranged, for example. In other forms, another number of third chips may be arranged.

In this form, along a direction parallel to the surface of the first chip 10, a transverse dimension of each of the third chips 30 is less than a transverse dimension of the first chip 10. Therefore, after the chipset is subsequently bonded to the first chip 10, a part of the first chip can be exposed from the chipset 300. That is, the second bonding region 10*ii* can be exposed from the chipset 300, thereby providing a space for bonding the second chip to the first chip.

Still referring to FIG. 11 to FIG. 13, the chipset 300 is bonded to the first bonding region 10*i*, the second bonding region 10*ii* is exposed from the projection of the chipset 300 on the first chip 10, and the third chip 30 adjacent to the first chip 10 is electrically connected to the first chip 10 (1707).

The third chip 30 adjacent to the first chip 10 is electrically connected to the first chip 10, so that the electrical integration between the chipset 300 and the first chip 10 is realized by electrically connecting each of third chips 30 in the chipset 300 to the first chip 10.

Since the second bonding region 10*ii* is exposed from the projection of the chipset 300 on the first chip 10, a part of the second chip 20 can be conveniently bonded to the second bonding region 10*ii*.

In this form, the chipset 300 is bonded to the first bonding region 10*i* of the first chip 10 by the third conductive bumps 230.

In this form, a material of each of the third conductive bumps 230 includes one or more of tin, copper, aluminum, tungsten, cobalt, nickel, titanium, tantalum, titanium nitride, or tantalum nitride. In an example, the material of the third conductive bump 230 is tin.

In an example, the third conductive bumps 230 are formed on the chipset 300, and the third conductive bumps 230 are electrically connected to the first chip 10.

In other forms, the third conductive bumps may be formed on the first chip, and the third conductive bumps are electrically connected to the chipset. Alternatively, a third sub-bump is formed on the first chip, a fourth sub-bump is formed on the chipset, and the third sub-bump is connected to the fourth sub-bump.

It should be noted that, in this form, the chipset 300 is bonded to the first bonding region 10*i* after the first chip 10 is attached to the carrier substrate 105, for example.

In other forms, the chipset may be bonded to the first bonding region before the first chip is attached to the carrier substrate.

During specific implementation, the packaging method may further include: forming, on the first chip, a second packaging layer covering a sidewall of the second chip and the second bonding region after bonding the chipset to the first bonding region and before attaching the first chip to the carrier substrate.

Correspondingly, the packaging method may further include: removing the second packaging layer arranged in the second bonding region after forming the second packaging layer and before bonding the third bonding region to the second bonding region, to expose the second bonding region, thereby bonding the second bonding region to the second chip. Specifically, the second packaging layer arranged in second bonding region may be removed by a dry etching process.

It should be further noted that, during specific implementation, the second bonding region 10*ii* of the first chip 10 may be bonded to the third bonding region 20II of the second chip 20 after the chipset 300 is bonded to the first chip 10. Alternatively, the chipset may be bonded to the first bonding region 10*i* of the first chip 10 after the second bonding region 10*ii* of the first chip 10 is bonded to the third bonding region 20II of the second chip 20.

In addition, in this form, the first chip 10 is bonded to the chipset 300 by the third conductive bump 230 and the second chip 20 is bonded to the first chip 10 by the first conductive bump 210, for example. However, the bonding between the first chip and the chipset and between the second chip and the first chip is not limited thereto. For example, in other forms, the conductive bumps may be formed on the first chip, and the bonding between the first chip and the chipset and between the second chip and the first chip is realized by the conductive bumps.

Figure 14:
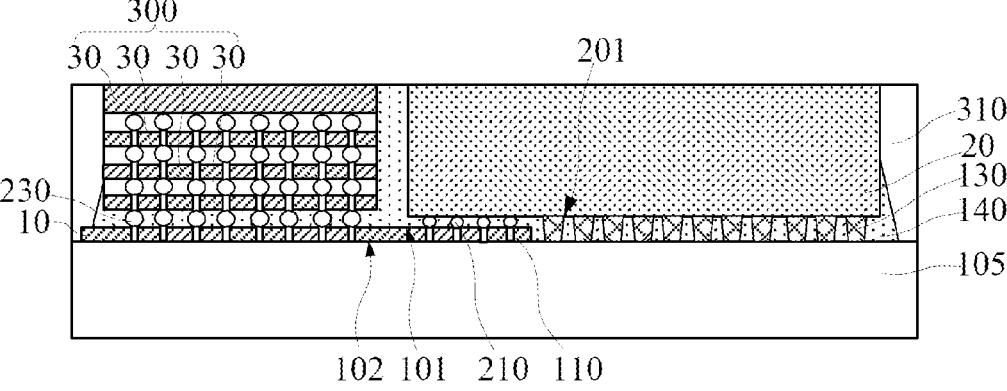

Referring to FIG. 14, in this form, the packaging method further includes: forming, on the carrier substrate 105, a first packaging layer 310 covering the chipset 300, a sidewall of the second chip 20, and the first chip 10 after bonding the third bonding region 20I to the second bonding region 10*ii* and bonding the chipset 300 to the first bonding region 10*i*.

The first packaging layer 310 is configured to realize packaging integration of the chipset 300 with the first chip 10 and the second chip 20. The first packaging layer 310 can further function to provide insulation, sealing, and moisture protection, thereby helping improve the packaging reliability.

In an form, a material of the first packaging layer 310 is a molding material, for example, epoxy resin. Epoxy resin has advantages such as low shrinkage, desirable viscosity, desirable corrosion resistance, excellent electrical properties, and low costs. In other forms, the first packaging layer may be made of other suitable packaging materials.

It should be noted that, in this form, after the first chip 10 is bonded to the carrier substrate 105, the chipset 300 is bonded to the first chip 10, and the second chip 20 is bonded to the first chip 10. Therefore, in the step of forming the first packaging layer 310, the first packaging layer 310 can package the first chip 10, the second chip 20, and the chipset 300 more effectively, and the first packaging layer 310 can provide effective overall fixing and sealing for the first chip 10, the second chip 20, and the chipset 300, thereby helping improve packaging reliability.

In this form, step of forming the first packaging layer 310 includes: forming, on the carrier substrate 105, a packaging material layer (not shown) covering the chipset 300, the first chip 10, and the second chip 20, where the packaging material layer further covers tops of the chipset 300 and the second chip 20; and removing the packaging material layer on the tops of the chipset 300 and the second chip 20.

In this form, the packaging material layer is formed by a molding process. In other forms, the packaging material layer may be formed by other proper processes based on an actual process demand.

In this form, the packaging material layer on the tops of the chipset 300 and the second chip 20 is removed by a grinding process, to improve a flatness of a top surface of the first packaging layer 310, thereby facilitating a subsequent process.

It should be noted that, in this form, after the third bonding region 20I is bonded to the second bonding region 10ii and the chipset 300 is bonded to the first bonding region 10i and before the first packaging layer 310 is formed, the packaging method further includes: forming a sealing layer 140 between the second bonding region 10ii and the third bonding region 20I and configured to fill a gap between the first conductive bumps 210 and fill a region defined by the fourth bonding region 20II and the conductive post 130.

In this form, the sealing layer 140 is used as the first sealing layer 140.

The first sealing layer 140 is configured to seal the first conductive bumps 210 and the conductive post 130, to protect the first conductive bumps 210 and the conductive post 130, and correspondingly improve packaging reliability.

In this form, the first sealing layer 140 is also filled in a region defined by the first bonding region 10i of the first chip 10, the chipset 300, and the third conductive bumps 230 to seal the third conductive bumps 230.

In an example, a material of the first sealing layer 140 is epoxy resin. Specifically, in this form, the first sealing layer 140 is formed by an underfill process.

Figure 15:
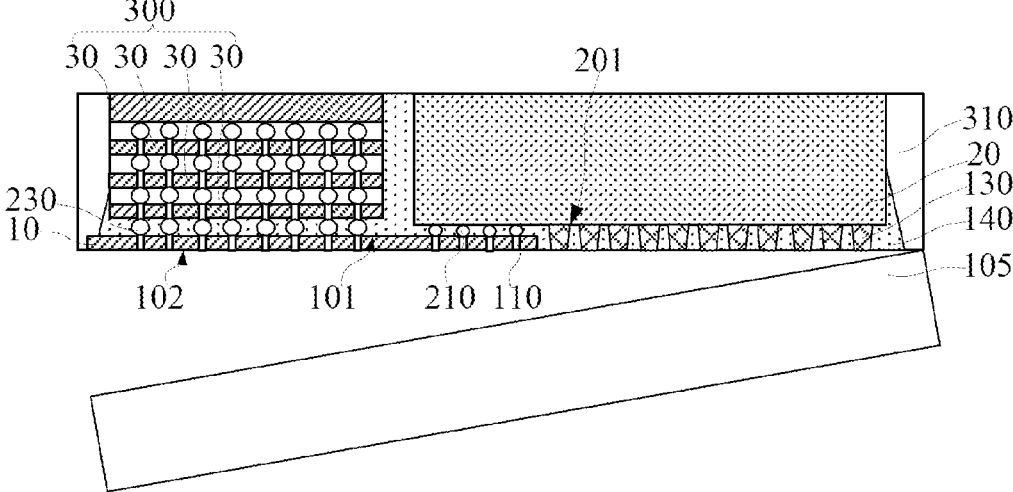

Referring to FIG. 15, the carrier substrate 105 is removed to expose the second surface 102 of the first chip 10 and the end surface of the conductive post 130 facing away from the second chip 20, so as to facilitate subsequent bonding of the second surface 102 of the first chip 10 to the substrate and bonding of the conductive post 130 to the substrate (1708).

Specifically, the carrier substrate 105 is removed by a debonding process.

Figure 16:
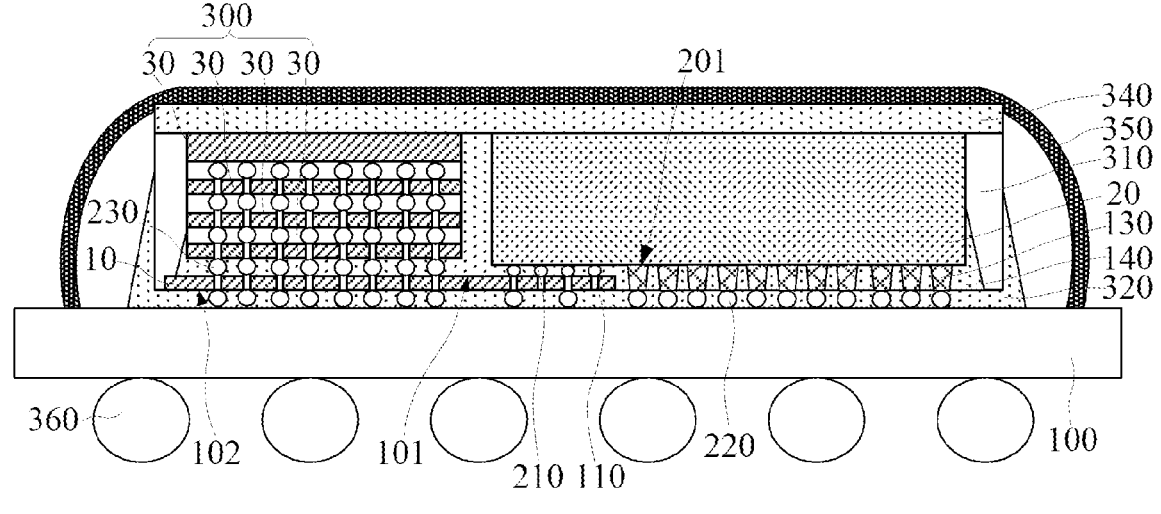

Referring to FIG. 16, the substrate 100 is bonded to the second surface 102 of the first chip 10 and the conductive post 130, to electrically connect the substrate 100 to the first chip 10 and the conductive post 130 (1709).

Packaging integration and electrical integration of the chipset 300 and the first chip 10 with the second chip 20 and the substrate 100 are realized by bonding the substrate 100 to the second surface 102 of the first chip 10 and the conductive post 130.

The substrate 100 is electrically connected to the first chip 10 and the conductive post 130, so that the substrate 100 is electrically connected to the chipset 300 by the first chip 10 and is electrically connected to the second chip 20 by the conductive post 130.

In this form, the substrate 100 is a PCB.

In this form, the substrate 100 is electrically connected to the second surface 102 of the first chip 10 and the substrate 10 is electrically connected to the conductive post 130 by second conductive bumps 220.

In this form, the second conductive bumps 220 are in contact with the second surface 102 of the first chip 10, the conductive post 130, and the substrate 100, so that electrical connection between the substrate 100 and the first surface 102 of the first chip 10 and the conductive post 130 can be realized merely by the second conductive bumps 220 without an additional interposer structure, thereby helping further shorten the transmission paths between the substrate 100 and the first surface 102 of the first chip 10 and the conductive post 130, and further improve the performance of the packaging structure.

In this form, the second conductive bumps 220 are first solder balls. In this form, a material of each of the second conductive bumps 220 includes one or more of tin, copper, aluminum, tungsten, cobalt, nickel, titanium, tantalum, titanium nitride, or tantalum nitride. In an example, the material of the second conductive bump 220 is tin.

Specifically, the first solder ball is C4. C4 has excellent electrical and thermal properties. In case of a same solder ball spacing, C4 can achieve a higher I/O density, and is free of limitation by a size of an interconnecting structure. In addition, C4 is suitable for mass production and greatly reduces a size and a weight.

In this form, after the substrate 100 is electrically connected to the second surface 102 of the first chip 10 and the substrate 100 is electrically connected to the conductive post 130 by the second conductive bumps 220, an underfill process is performed. A second sealing layer 320 is filled in a gap between adjacent second conductive bumps 220 between the second surface 102 and the substrate 100 and in a gap between adjacent second conductive bumps 220 between a bottom surface of the first packaging layer 310 and the substrate 100, to seal the second conductive bumps 220.

In an example, a material of the second sealing layer 320 is epoxy resin.

It should be further noted that, after the substrate 100 is bonded to the second surface 102 of the first chip 10 and to the conductive post 130, the packaging method further includes: forming a thermally conductive layer 340 on the chipset 300, the second chip 20, and the first packaging layer 310. The thermally conductive layer 340 is configured to realize heat conduction and heat dissipation.

In this form, a material of the thermally conductive layer 340 is a TIM. For example, the material of the thermally conductive layer 340 is silica gel.

In this form, the packaging method further includes: forming a packaging housing 350 on the substrate 100 after forming the thermally conductive layer 340, where the packaging housing 350 covers the chipset 300, the second chip 20, the first chip 10, and the first packaging layer 310. Specifically, in this form, the packaging housing 350 is arranged on the thermally conductive layer 340 and is in contact with the thermally conductive layer 340, so that the thermally conductive layer 340 realizes heat dissipation.

The packaging housing 340 is configured for mechanical protection of the chips inside and transitional connection of chip electrodes to the outside, and helps ensure correct realization of various functional parameters of the chips and environmental conditions required when the circuit is used.

In this form, a material of the packaging housing 340 includes metal, that is, the packaging housing 340 is a metal packaging housing. In other forms, the packaging housing may be a plastic packaging housing, a ceramic packaging housing, or the like.

In this form, the packaging method further includes: forming fourth conductive bumps 360 on a surface on a side of the substrate 100 facing away from the first chip 10, where the fourth conductive bumps 360 are configured to electrically connect the packaging structure to an external circuit.

In this form, the fourth conductive bumps 360 are second solder balls. In an example, a material of each of the second solder balls is tin.

Although the present disclosure is disclosed above, the present disclosure is not limited thereto. Any person skilled in the art can make various changes and modifications without departing from the spirit and the scope of the present disclosure. Therefore, the protection scope of the present disclosure should be subject to the scope defined by the claims.

What is claimed is:

1. A packaging structure, comprising:

a substrate;

a first chip, comprising a first surface and a second surface opposite to each other, wherein the first surface comprises a first bonding region configured to bond to a chipset and a second bonding region configured to bond to a second chip, and the second surface is bonded to the substrate;

a second chip, comprising a third surface, wherein the third surface comprises a third bonding region bonded to the second bonding region, and a remaining region of the third surface is used as a fourth bonding region;

a conductive post, arranged in the fourth bonding region, wherein an end of the conductive post facing away from the second chip is bonded to the substrate;

the chipset, bonded to the first bonding region of the first chip, wherein the second bonding region is exposed from a projection of the chipset on the first chip, the chipset comprises one or more third chips stacked along a longitudinal direction, adjacent third chips along a longitudinal direction are electrically connected, and the third chip adjacent to the first chip is electrically connected to the first chip; and a first packaging layer arranged on the substrate and covering the chipset, a sidewall of the second chip, and the first chip, wherein a bottom surface of the first packaging layer is leveled with the second surface of the first chip and higher than a top surface of the substrate.

2. The packaging structure according to claim 1, wherein the second bonding region is arranged opposite to the third bonding region, and the packaging structure further comprises first conductive bumps arranged between the second bonding region and the third bonding region.

3. The packaging structure according to claim 2, further comprising:

a first sealing layer arranged between the second bonding region and the third bonding region and configured to fill a gap between the first conductive bumps and fill a region defined by the fourth bonding region and the conductive post.

4. The packaging structure according to claim 1, further comprising second conductive bumps arranged between the substrate and the second surface of the first chip, and between the substrate and the end of the conductive post facing away from the second chip.

5. The packaging structure according to claim 4, further comprising:

a first packaging layer, arranged on the substrate and covering the chipset, a sidewall of the second chip, and the first chip; and a second sealing layer, arranged in a gap between adjacent second conductive bumps between the second surface and the substrate and in a gap between adjacent second conductive bumps between a bottom surface of the first packaging layer and the substrate.

6. The packaging structure according to claim 1, further comprising:

third conductive bumps arranged between the first bonding region of the first chip and the chipset.

7. The packaging structure according to claim 1, further comprising:

fourth conductive bumps arranged on a surface on a side of the substrate facing away from the first chip.

8. The packaging structure according to claim 1, wherein a ratio of an area of the second bonding region to a total area of the first chip ranges from 5% to 20%.

9. The packaging structure according to claim 1, wherein the first chip is a first logic chip, the second chip is a second logic chip, and the third chip is a memory chip.

10. The packaging structure according to claim 1, further comprising:

a thermally conductive layer, arranged on the chipset and on the second chip; and a packaging housing, arranged on the substrate, configured to package the chipset, the second chip, and the first chip, and in contact with the thermally conductive layer.

* * * * *